United States Patent
Yamaya

(10) Patent No.: US 9,261,795 B2
(45) Date of Patent: Feb. 16, 2016

(54) METHOD OF MANUFACTURING SEMICONDUCTOR DEVICE USING MULTIPLE IMMERSION AREAS

(75) Inventor: Shuichi Yamaya, Kanagawa (JP)

(73) Assignee: Renesas Electronics Corporation, Tokyo (JP)

(*) Notice: Subject to any disclaimer, the term of this patent is extended or adjusted under 35 U.S.C. 154(b) by 685 days.

(21) Appl. No.: 13/525,297

(22) Filed: Jun. 16, 2012

(65) Prior Publication Data
US 2012/0329281 A1    Dec. 27, 2012

(30) Foreign Application Priority Data
Jun. 22, 2011 (JP) ................. 2011-138042

(51) Int. Cl.
*G03F 7/20* (2006.01)
*H01L 21/027* (2006.01)
*H01L 21/8238* (2006.01)

(52) U.S. Cl.
CPC ........ *G03F 7/70341* (2013.01); *G03F 7/70908* (2013.01); *G03F 7/70916* (2013.01); *G03F 7/70925* (2013.01); *H01L 21/0274* (2013.01); *H01L 21/8238* (2013.01)

(58) Field of Classification Search
CPC .................................................. G03F 7/70341
See application file for complete search history.

(56) References Cited

U.S. PATENT DOCUMENTS

| | | | |
|---|---|---|---|
| 7,990,516 B2 | 8/2011 | Takaiwa et al. | |
| 8,064,044 B2 | 11/2011 | Nagasaka | |
| 2009/0081588 A1 | 3/2009 | Hatakeyama et al. | |
| 2010/0283979 A1* | 11/2010 | Nakano et al. | 355/30 |

FOREIGN PATENT DOCUMENTS

| | | |
|---|---|---|
| JP | 2005-223315 A | 8/2005 |
| JP | 2005-286286 A | 10/2005 |
| JP | 2005-347617 A | 12/2005 |
| JP | 2009-021498 A | 1/2009 |
| JP | 2010-103576 A | 5/2010 |
| JP | 2011-035074 A | 2/2011 |
| TW | 2010-17347 A | 5/2010 |
| WO | WO 2005055296 A1 * | 6/2005 |
| WO | WO 2010/050240 A1 | 5/2010 |

OTHER PUBLICATIONS

Office Action issued Nov. 4, 2014, in Japanese Patent Application No. 2011-138042.
Office Action mailed May 7, 2015 for related Japanese Patent Application No. 2011-138042.
Office Action mailed May 5, 2015 for related Chinese Patent Application No. 2012-10230158.9.

* cited by examiner

*Primary Examiner* — Peter B Kim
*Assistant Examiner* — Michelle Iacoletti
(74) *Attorney, Agent, or Firm* — Shapiro, Gabor and Rosenberger, PLLC

(57) ABSTRACT

A shape defect in a transfer pattern formed over the major surface of a substrate is prevented by using an immersion exposure method. When exposure light is radiated onto a resist, immersion water is held in a first immersion area between each of the lower surfaces of an optical element of a projection optical system and a nozzle portion, and a resist; and when a focus, optical system alignment, or the like, is regulated, the immersion water is held in a second immersion area between each of the lower surfaces of the optical element of the projection optical system and the nozzle portion, and the upper surface of a measurement stage. A transverse spread of the immersion water held in the first immersion area is made smaller than that of the immersion water held in the second immersion area.

16 Claims, 11 Drawing Sheets

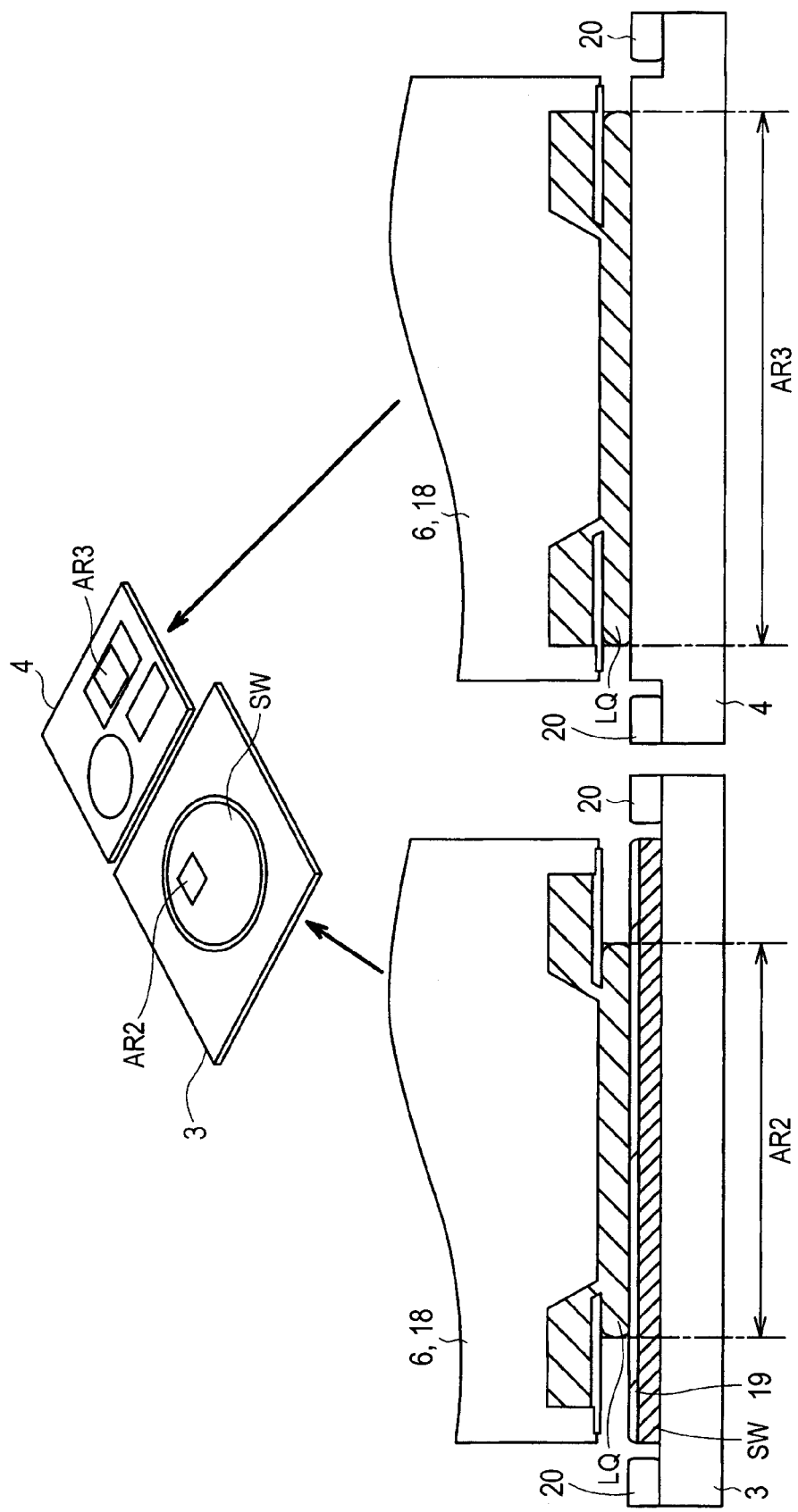

METHOD OF MANUFACTURING SEMICONDUCTOR DEVICE USING MULTIPLE IMMERSION AREAS

CROSS-REFERENCE TO RELATED APPLICATIONS

The disclosure of Japanese Patent Application No. 2011-138042 filed on Jun. 22, 2011 including the specification, drawings and abstract is incorporated herein by reference in its entirety.

BACKGROUND

The present invention relates to a technique for manufacturing a semiconductor device, and in particular, to a technique that is effective when applied to the manufacture of a semiconductor device using an exposure apparatus in which exposure light is radiated onto a substrate via a projection optical system and a liquid.

Exposure apparatuses are required to have higher resolution year by year, and with this trend, it is promoted to make the wavelength of exposure light to be small and the aperture of a projection optical system to be large. However, there is a problem that the above measures make a depth of focus to be small although they improve the resolution. Accordingly, an immersion exposure method is under consideration in recent years, in which exposure is performed by forming, between the lower surface of a projection optical system and a substrate in an exposure apparatus, an immersion area filled with immersion water, such as pure water or an organic solvent each having a refractive index higher than that of air. In this method, the wavelength of exposure light can be substantially made small and a depth of focus can be made larger in comparison with that in air.

For example, Japanese Unexamined Patent Publication No. 2005-347617 discloses a technique in which supply and recovery of a liquid can be efficiently performed, by making a nozzle member provided in an immersion exposure apparatus have a structure including a laminated body formed of a plurality of members, and by providing a porous area in at least one of the of members forming the laminated body, thereby maintaining the strength of the nozzle member and improving a degree of freedom in design. In addition, an aspect, etc., is described in which, by making the supply amount of the liquid to be large prior to exposure of a substrate, bubbles that may have been adhered to, for example, the liquid contact surface of an optical element, the lower surface of the nozzle member, or the surface of the substrate are removed with the momentum of a flow of the liquid, and thereafter an optimal supply amount of the liquid is supplied to an immersion area when a substrate is exposed.

Also, Japanese Unexamined Patent Publication No. 2009-21498 disclosures an immersion exposure apparatus including: a first supply port for supplying a liquid; an immersion member that has a first surface arranged in at least part of the periphery of the light path of exposure light and is capable of holding the liquid supplied from the first supply port between an object movable with respect to the first surface and the first surface; and a dryness prevention device for preventing the first surface from being dried.

Also, Japanese Unexamined Patent Publication No. 2005-223315 discloses an immersion exposure apparatus in which a failure, occurring due to a fluctuation in the pressure of a liquid (e.g., deformation of a substrate or a substrate stage, displacement of a projection optical system, or occurrence of vibrations), is solved by regulating, with a pressure regulation mechanism, the pressure of the liquid supplied from a liquid supply mechanism.

Also, Japanese Unexamined Patent Publication No. 2005-286286 discloses an immersion exposure method in which deformation of a substrate or a substrate stage and occurrence of vibrations are prevented by setting the affinity of the surface of the substrate with respect to a liquid such that the force of the liquid on the substrate exerting on the substrate is reduced.

SUMMARY

In an immersion exposure apparatus, immersion water is supplied from an immersion supply unit to an immersion area between the lower surface of a projection optical system and a substrate, and the immersion water in the immersion area is recovered by an immersion recovery unit. However, minute foreign substances, resulting from peeling-off, etc., of either a resist coated on the major surface of the substrate or an organic material (Top Coat) coated on the surface of the resist, are gradually accumulated in the flow channel, etc., of the immersion recovery unit during immersion exposure. The aforementioned minute foreign substances may possibly enter the immersion water again to be adhered to the surface of a resist on which the immersion exposure is to be performed during the subsequent immersion exposure. As a result of the study by the present inventors, a shape defect, etc., resulting from the aforementioned minute foreign substances has been found in a transfer pattern formed over the major surface of a substrate (a resist pattern formed by performing immersion exposure and a development process on a resist), the shape defects, etc., causing approximately 5 to 7% of a decrease in the manufacturing yield of semiconductor devices.

An object of the present invention is to provide a technique in which a shape defect in a transfer pattern formed over the major surface of a substrate is prevented by using an immersion exposure method, thereby allowing the manufacturing yield of semiconductor devices to be improved.

The aforementioned and other objects of the present invention and new features thereof will be made clear by the description of the present specification and accompanying drawings.

Of the inventions disclosed in the present application, an embodiment of a typical invention will be briefly described as follows:

In a manufacturing process of semiconductor devices in which a pattern image of a mask is projected and exposed onto a substrate by using an immersion exposure method according to this embodiment, when exposure light is radiated onto a resist, immersion water is held in a first immersion area between each of the lower surfaces of an optical element of a projection optical system and a nozzle portion, and the resist; and when a focus, optical system alignment, or the like, is regulated, the immersion water is held in a second immersion area between each of the lower surfaces of the optical element of the projection optical system and the nozzle portion, and the upper surface of a measurement stage. A transverse spread of the immersion water held in the first immersion area is made smaller than that of the immersion water held in the second immersion area.

An advantage obtained by an embodiment of a typical invention, of the inventions disclosed in the present application, will be briefly described as follows:

A shape defect, etc., in a transfer pattern formed over the major surface of a substrate can be prevented by using an immersion exposure method, thereby allowing the manufacturing yield of semiconductor devices to be improved.

BRIEF DESCRIPTION OF THE DRAWINGS

FIG. 3 is a schematic view explaining an immersion area over the exposure stage and that over the measurement stage, provided in the immersion exposure apparatus according to the embodiment of the invention;

DETAILED DESCRIPTION

Figure 1:
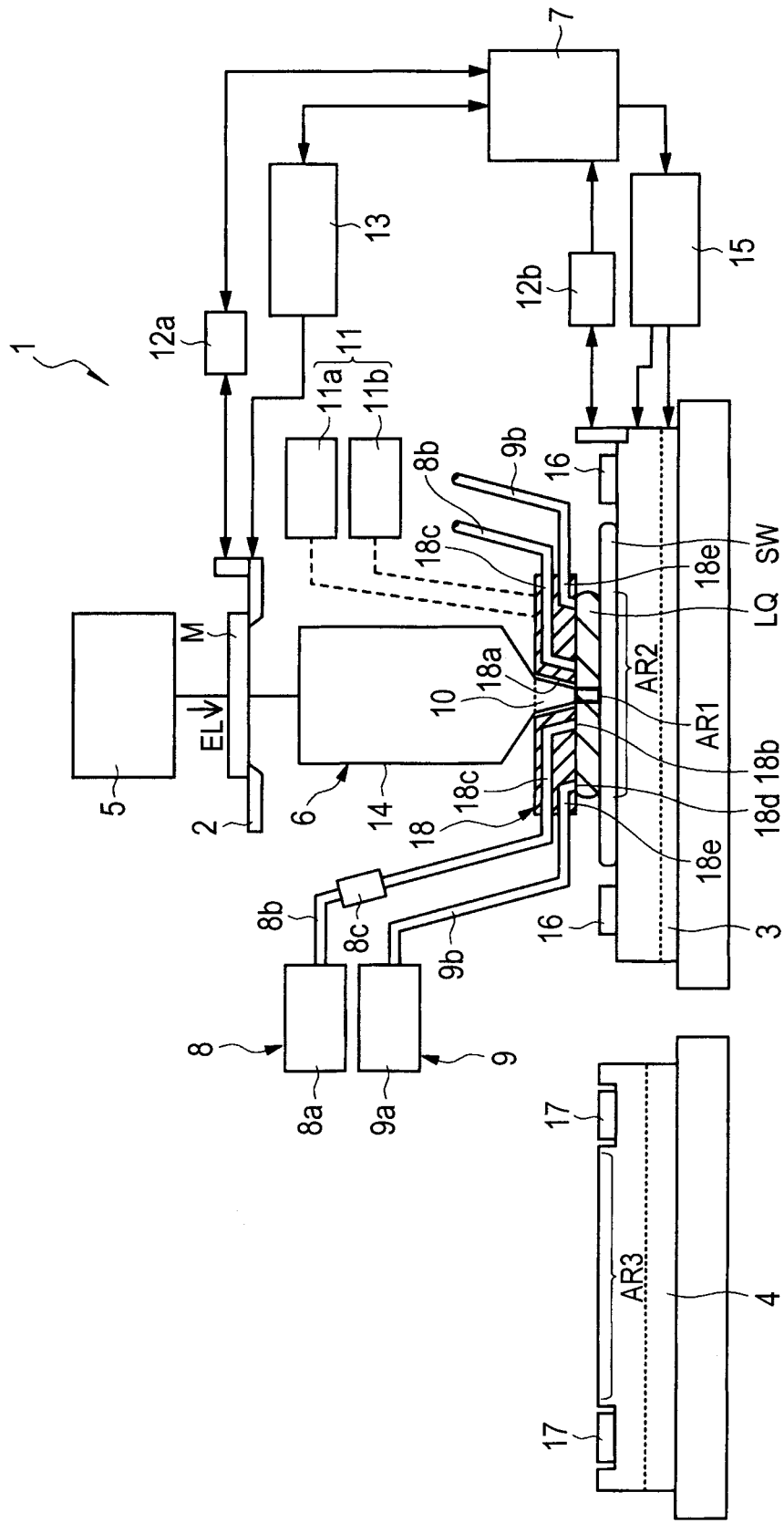
FIG. 1 is a schematic configuration view illustrating an immersion exposure apparatus according to an embodiment of the present invention.

If needed for convenience, the following embodiment will be described by dividing it into multiple sections or embodiments; however, the multiple sections or embodiments are not irrelevant to each other, but they are in a relationship in which one is a variation, detailed description, or supplementary description of part or the whole of the others, unless otherwise indicated.

When the number of elements, etc., (including the number of pieces, numeric value, amount, and range, etc.) is mentioned in the following embodiment, the number thereof should not be limited to the specific number, but may be a number larger than or equal to or smaller than or equal to the specific number, unless otherwise indicated or clearly limited to the specific number in principle. Also, in the following embodiment, it is needless to say that the constituents (also including element steps, etc.) are not necessarily essential, unless otherwise indicated or clearly essential in principle.

Likewise, when the shapes or positional relationships of the constituents are mentioned in the following embodiment, shapes, etc., substantially approximate or similar to the above shapes, etc., are to be included, unless otherwise indicated or clearly considered otherwise in principle. The same is true with the aforementioned numeric value and range.

In the views used in the flowing embodiment, hatching is sometimes drawn for easy viewing, even in a plan view. Also, in the following embodiment, MISFET (Metal Insulator Semiconductor Field Effect Transistor) representing field-effect transistors is abbreviated as MIS, p-channel MISFET as pMIS, and n-channel MISFET as nMIS. Also, in the following embodiment, a wafer mainly refers to an Si (Silicon) single crystalline wafer, but in addition to that, it also refers to an SOI (Silicon-On-Insulator) wafer and an insulating film substrate over which an integrated circuit is to be formed, etc. Shapes of the wafer include a circle, approximate circle, square, and rectangle, etc.

In the whole views for explaining the following embodiment, members or parts having the same function as each other will be denoted with the same reference numeral and duplicative description will be omitted. Hereinafter, the embodiment of the present invention will be described in detail based on the accompanying views.

Figures 11A, 11B:
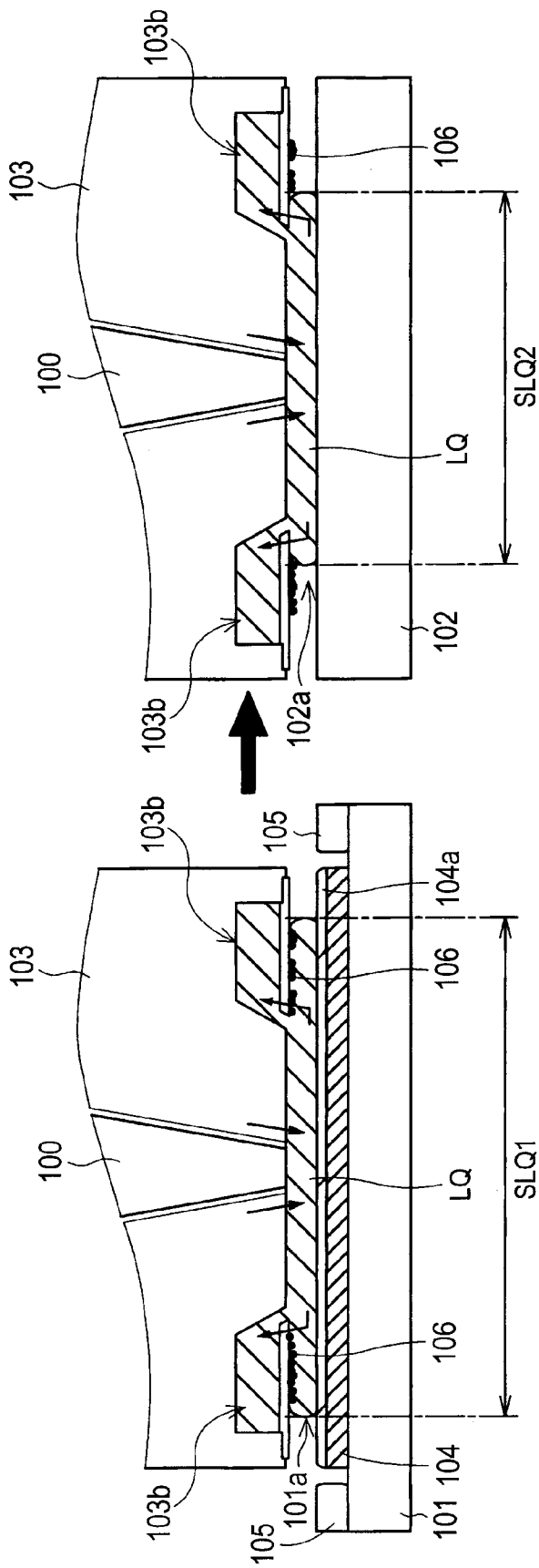
FIGS. 11A and 11B are schematic views respectively explaining an immersion area over an exposure stage and that over a measurement stage, provided in an immersion exposure apparatus studied by the present inventors prior to the invention.
Figure 12:
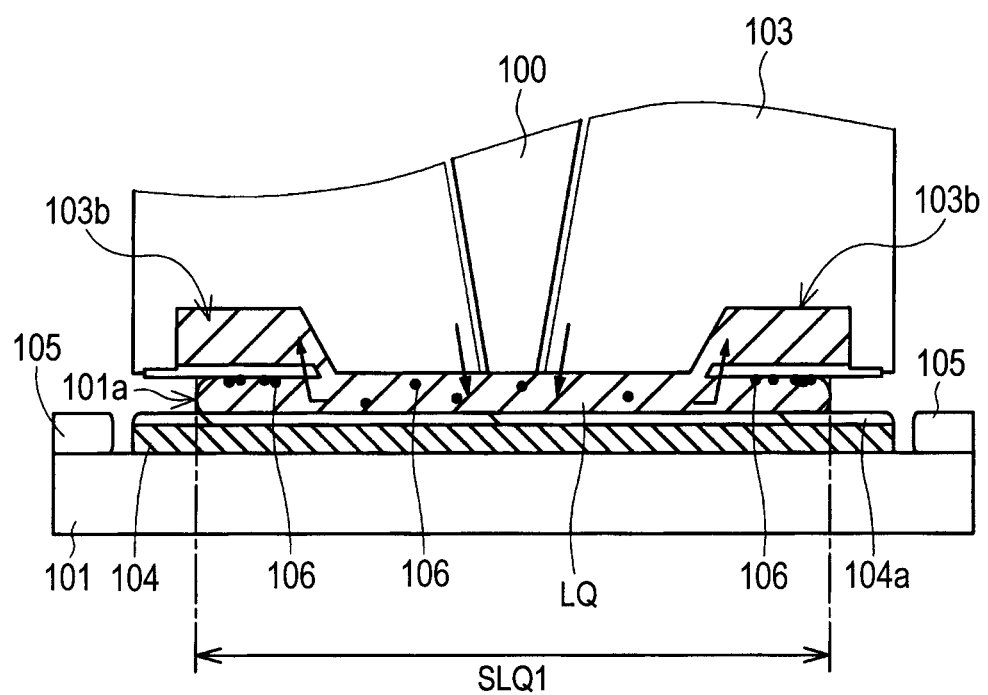
FIG. 12 is a schematic view explaining the immersion area over the exposure stage provided in the immersion exposure apparatus studied by the inventors prior to the invention.

In order to make clearer a method of manufacturing a semiconductor device according to an embodiment of the present invention, an occurrence model in which a shape defect, etc., in a transfer pattern occurred in the immersion exposure studied by the present inventors, will be first and briefly described with reference to FIGS. 11A, 11B, and FIG. 12. FIGS. 11A and 11B are schematic views respectively explaining an immersion area over an exposure stage and that over a measurement stage, provided in an immersion exposure apparatus studied by the present inventors prior to the invention; and FIG. 12 is a schematic view explaining the immersion area over the exposure stage provided in the immersion exposure apparatus studied by the inventors prior to the invention.

As illustrated in FIGS. 11A and 11B, the immersion exposure apparatus is provided with both an exposure stage 101 on which exposure of a substrate is performed and a measurement stage 102 on which regulation of a focus, optical system alignment, or the like, (hereinafter, sometimes simply referred to as measurement) is performed.

Over the exposure stage 101, immersion water LQ is held between the lower surface of a projection optical system 100 and the surface of a resist (not only the resist, but also a resist whose surface has been coated with an organic material (Top Coat) are included) 104a coated on the major surface of a substrate 104. Further, a nozzle portion 103 is installed around the projection optical system 100, and an immersion area 101a is provided, in which the immersion water LQ is held between each of the lower surfaces of the projection optical system 100 and the nozzle portion 103, and the surface of the resist 104a coated on the major surface of the substrate 104. The nozzle portion 103 is formed of, for example, an immersion supply unit (not illustrated) for supplying the immersion water LQ and an immersion recovery unit 103b for recovering the immersion water LQ that is provided further outside the immersion supply unit. Accordingly, each of the lower surfaces of the projection optical system 100 and the nozzle portion 103 is in contact with the immersion water LQ in the immersion area 101a.

Generally, the water repellency of the nozzle portion 103 is low and that of the resist 104a is also low, and a dynamic receding contact angle of each of them is, for example, 65° or larger and 84° or smaller. Accordingly, the immersion water LQ is likely to spread in a transverse direction (direction parallel to the upper surface of the exposure stage 101) and leak outside the substrate 104, over the exposure stage 101. Accordingly, the leak of the immersion water LQ outside the substrate 104 is prevented by installing a water-repellent plate 105 having high water repellency around the substrate 104, over the exposure stage 101. The space between the lower surface of the nozzle portion 103 and the surface of the resist 104a coated on the major surface of the substrate 104 is, for example, smaller than or equal to 1 mm.

Over the measurement stage 102, an immersion area 102a is provided, in which the immersion water LQ is held between each of the lower surfaces of the projection optical system 100 and the nozzle portion 103, and the upper surface of the measurement stage 102. Accordingly, each of the lower surfaces of the projection optical system 100 and the nozzle portion 103 is in contact with the immersion water LQ in the immersion area 102a.

Over the measurement stage 102, leak of the immersion water LQ outside the immersion area 102a is prevented by forming the measurement stage 102 with a material having high water repellency whose dynamic receding contact angle is, for example, approximately 100°. The space between the lower surface of the nozzle portion 103 and the upper surface of the measurement stage 102 is, for example, smaller than or equal to 1 mm.

Although a transverse spread SLQ1 of the immersion water LQ in the immersion area 101a over the exposure stage 101 depends on a supply amount and a recovery amount, etc., of the immersion water LQ, it generally becomes large due to the low water repellency of each of the nozzle portion 103 and the resist 104a. When the transverse spread SLQ1 of the immersion water LQ becomes large, almost the whole lower surface of each of the immersion supply unit and the immersion recovery unit 103b in the nozzle portion 103 is immersed in the immersion water LQ, thereby possibly causing a minute foreign substance 106 in the immersion water LQ to be adhered to the lower surface of the immersion recovery unit 103b in the nozzle portion 103.

On the other hand, a transverse spread SLQ2 of the immersion water LQ in the immersion area 102a over the measurement stage 102 depends on a supply amount and a recovery amount, etc., of the immersion water LQ; however, it generally becomes small due to the high water repellency of the measurement stage 102. Accordingly, the transverse spread SLQ2 of the immersion water LQ in the immersion area 102a over the measurement stage 102 becomes smaller than the transverse spread SLQ1 of the immersion water LQ in the immersion area 101a over the exposure stage 101.

Accordingly, when the nozzle portion 103 is transferred from the exposure stage 101 to the measurement stage 102 for measurement after the immersion exposure has been completed, the whole lower surface of the immersion recovery unit 103b in the nozzle portion 103 is not immersed in the immersion water LQ, but only part of the lower surface is immersed in the immersion water LQ. The foreign substance 106 adhered to an area of the immersion recovery unit 103b in the nozzle portion 103, the area not being immersed in the immersion water LQ, is dried and firmly fixed thereto as it is.

The nozzle portion 103 is again transferred from the measurement stage 102 to the exposure stage 101 for immersion exposure after the measurement has been completed, and the lower surface of the immersion recovery unit 103b in the nozzle portion 103 is immersed in the immersion water LQ, as illustrated in FIG. 12. Thus, by repeating a state in which the lower surface 103b of the immersion recovery unit 103b in the nozzle portion 103 is immersed in the immersion water LQ and a state in which the lower surface thereof is not immersed therein, the number of foreign substances firmly fixed thereto gradually becomes large and the size of the foreign substance 106 becomes large. The foreign substances 106 firmly fixed to the lower surface of the immersion recovery unit 103b in the nozzle portion 103 is then peeled off and again mixed into the immersion water LQ, thereby causing a shape defect, etc. in a transfer pattern when the foreign substance 106 falls on the surface of the resist 104a during the immersion exposure.

For example, a method of intentionally swinging the immersion water LQ is considered as a method of removing the foreign substances 106 adhered to the lower surface of the immersion recovery unit 103b in the nozzle portion 103; however, it is needed to regularly stop the immersion exposure apparatus, thereby causing a problem that a decrease in the operating rate may be induced.

Embodiment

Figure 4:
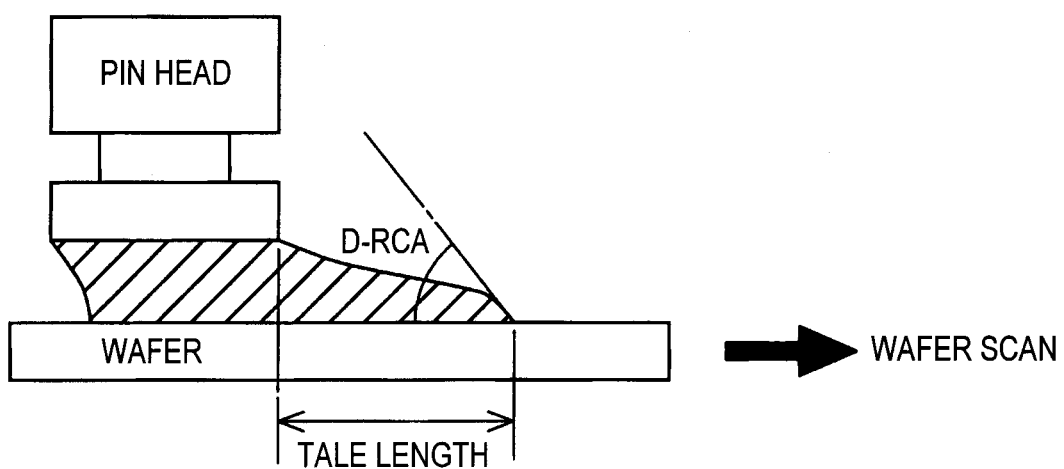
FIG. 4 is a pattern view explaining a definition of water repellency of immersion water used in the embodiment of the invention.

An immersion exposure method according to the present embodiment will be described with reference to FIGS. 1 to 4. FIG. 1 is a schematic view illustrating an immersion exposure apparatus according to the embodiment, FIGS. 2A to 2D are schematic views explaining a series of operations of an exposure stage and a measurement stage, provided in the immersion exposure apparatus according to the embodiment, FIG. 3 is a schematic view explaining an immersion area over the exposure stage and that over the measurement stage, provided in the immersion exposure apparatus according to the embodiment, and FIG. 4 is a pattern view explaining a definition of water repellency of immersion water used in the present embodiment.

As illustrated in FIG. 1, the immersion exposure apparatus 1 is provided with: a mask stage 2 for supporting a mask M; an exposure stage (first stage) 3 for supporting a substrate SW; a measurement stage (second stage) 4 on which a focus, optical system alignment, or the like, is regulated; an illumination optical system 5 for irradiating the mask M supported by the mask stage 2 with exposure light EL; a projection optical system 6 for projecting and exposing a pattern image of the mask M illuminated by the exposure light EL onto the substrate SW supported by the exposure stage 3; and a controller 7 for integrally controlling the whole operations of the immersion exposure apparatus 1.

The immersion exposure apparatus 1 is an exposure apparatus to which an immersion method has been applied to improve resolution by making the wavelength of the exposure light to be substantially small and to make a depth of focus to be substantially large. The apparatus 1 is provided with a liquid supply mechanism 8 for supplying a liquid onto the substrate SW and a liquid recovery mechanism 9 for recovering the liquid over the substrate SW.

In the immersion exposure apparatus 1, an immersion method is adopted in which the gap between an optical element (lens) 10 provided at the end on the image surface side of the projection optical system 6 and the substrate SW arranged to face the optical element 10 (actually, a resist coated on the major surface of the substrate SW, or an organic material (Top Coat) coated on the surface of the resist) is filled with the immersion water LQ. The pattern image of the mask M is projected and exposed onto the substrate SW by irradiating the substrate SW with the exposure light EL passing through the mask M via both the immersion water LQ between the projection optical system 6 and the substrate SW and the projection optical system 6.

The immersion exposure apparatus 1 is also provided with a pressure regulation mechanism 11 for regulating a pressure of the immersion water LQ supplied from the liquid supply mechanism 8. The pressure regulation mechanism 11 is provided with both a supply pressure regulation unit 11a for regulating the supply pressure of the immersion water LQ supplied from the liquid supply mechanism 8 and a recovery pressure regulation unit 11b for regulating the recovery pressure of the immersion water LQ recovered by the liquid recovery mechanism 9. An operation of the pressure regulation mechanism 11 is controlled by the controller 7.

The immersion exposure apparatus 1 is also a scanning exposure apparatus in which the pattern image of the mask M is projected and exposed onto the substrate SW while the mask M and the substrate SW are respectively being transferred in the directions of the scanning direction opposite to each other and in a synchronized manner with each other.

The illumination optical system 5 is used for irradiating the mask M supported by the mask stage 2 with the exposure light EL such that a predetermined irradiation area on the mask M is irradiated with the exposure light EL having a uniform illuminance distribution, the exposure light EL being generated by the illumination optical system 5. As the exposure light EL radiated from the illumination optical system 5, for example: far-ultraviolet light (DUV light), such as bright line (g-line, h-line, or i-line) radiated from a mercury lamp, KrF excimer laser beam (wavelength: 248 nm), or the like; or vacuum ultraviolet light (VUV light), such as ArF excimer laser beam (wavelength: 193 nm), $F_2$ laser beam (wavelength: 157 nm), or the like, is used.

Pure water (e.g., refractive index: 1.44) is used as the immersion water LQ. Not only ArF excimer laser beam, but also far-ultraviolet light, such as, for example, bright line (g-line, h-line, or i-line) or KrF excimer laser light can pass through pure water.

The mask stage 2 can be transferred while supporting the mask M. The mask M is fixed by, for example, vacuum absorption (or electrostatic adsorption). The controller 7 drives a mask stage drive device 13 based on a measurement result by a laser interferometer 12a to position the mask M supported by the mask stage 2.

The projection optical system 6 projects and exposes, with a predetermined projection magnification, the pattern image of the mask M onto the substrate SW, and is formed of a plurality of optical elements including the optical element 10 provided at the end on the image surface side, these optical elements being supported by a lens barrel 14. The projection optical system 6 is a reduction system having a projection magnification of, for example, ¼ or ⅕. Alternatively, the projection optical system 6 may be either a unit system or a spreading system.

The immersion water LQ is brought into contact with the lower surface of the optical element 10 provided at the end on the image surface side of the projection optical system 6. The optical element 10 is formed of fluorite. Because the hydrophilicity of the surface of fluorite or the surface of the fluorite to which magnesium fluoride ($MgF_2$), alumina ($Al_2O_3$), silicon oxide ($SiO_2$), or the like, has been adhered, is high, the immersion water LQ can be adhered to the whole lower surface of the optical element 10. That is, the adhesion between the lower surface of the optical element 10 and the immersion water LQ is high, and hence the light path between the optical element 10 and the substrate SW can be surely filled with the immersion water LQ. Alternatively, the optical element 10 may be formed of quartz having high hydrophilicity. Alternatively, the hydrophilicity of the lower surface of the optical element 10, with the immersion water LQ, may be enhanced by performing a hydrophilic (lyophilic) treatment thereon.

The exposure stage 3 can be transferred while supporting the substrate SW, and is formed to include an XY stage and a Z-tilt stage mounted over the XY stage. The controller 7 controls the movement of an exposure stage drive device 15 based on a measurement result by the laser interferometer 12 to position the substrate SW supported by the exposure stage 3.

An immersion area (first immersion area) AR2, which includes the projection area AR1 of the projection optical system 6 and the transverse area of which is larger than that of the projection area AR1 and smaller than that of the substrate SW, is included over the exposure stage 3. At least while the pattern image of the mask M is being transferred over the substrate SW, the immersion water LQ supplied from the liquid supply mechanism 8 is held in the immersion area AR2.

Over the exposure stage 3, a water-repellent plate (plate member) 16 is provided so as to surround the substrate SW supported by the exposure stage 3. The water-repellent plate 16 is an annular member and arranged outside the substrate SW. The water-repellent plate 16 has a flat plane (flat portion) located at almost the same height as the major surface of the substrate SW supported by the exposure stage 3.

The water-repellent plate 16 is formed of a material having water repellency, such as, for example, polytetrafluoroethylene (Teflon (registered trademark)). Accordingly, the surface thereof has water repellency. Alternatively, the surface thereof may be water-repellent by, for example, forming the water-repellent plate 16 with a predetermined metal to perform a water-repellent treatment on the surface of the water-repellent plate 16 made of the metal.

The measurement stage 4 can be transferred and is formed to include an XY stage and a Z-tilt stage mounted over the XY stage. The movement of a measurement stage drive device (not illustrated) controlled by the controller 7.

An immersion area (second immersion area) AR3, which includes the projection area AR1 of the projection optical system 6 and the transverse spread of which is larger than that of the immersion area AR2 over the exposure stage 3, is included over the measurement stage 4. While various measurements of the focus and optical system alignment, etc., are being performed, the immersion water LQ supplied from the liquid supply mechanism 8 is held in the immersion area AR3.

Over the measurement stage 4, a water-repellent plate (plate member) 17 is provided so as to surround the immersion area AR3. The water-repellent plate 17 has a flat plane (flat portion) located at almost the same height as the major surface of the measurement stage.

The water-repellent plate 17 is formed of a material having water repellency, such as, for example, polytetrafluoroethylene (Teflon (registered trademark)). Accordingly, the surface thereof has water repellency. Alternatively, the surface thereof may be water-repellent by, for example, forming the water-repellent plate 17 with a predetermined metal to perform a water-repellent treatment on the surface of the water-repellent plate 17 made of the metal.

The liquid supply mechanism 8 is used for supplying a predetermined immersion water LQ to the image surface side of the projection optical system 6, and is provided with both a liquid supply unit 8a capable of sending out the immersion water LQ and a supply pipe 8b whose one end is coupled to the liquid supply unit 8a. The liquid supply unit 8a is provided with a tank for containing the immersion water LQ and a booster pump, etc. The immersion water LQ is supplied to the immersion area AR2 over the exposure stage 3 or to the immersion area AR3 over the measurement stage 4 by the liquid supply mechanism 8. The tank and booster pump in the liquid supply unit 8a are not necessarily provided in the immersion exposure apparatus 1, and can be substituted by the apparatuses in a factory where the immersion exposure apparatus 1 is installed.

The liquid recovery mechanism 9 is used for recovering the immersion water LQ and is provided with both a liquid recovery unit 9a capable of recovering the immersion water LQ and a recovery pipe 9b whose one end is coupled to the liquid recovery unit 9a. The liquid recovery unit 9a is provided with: a vacuum system (pumping device), such as, for example, a vacuum pump; a gas-liquid separation unit for separating the recovered immersion water LQ from a gas; and a tank for containing the recovered immersion water LQ, etc. Alternatively, a vacuum system in a factory where the immersion exposure apparatus 1 is installed may be used without providing, as a vacuum system, a vacuum pump in the immersion exposure apparatus 1.

A nozzle portion (flow channel forming member) 18 is arranged around the optical element 10 provided at the end on the image surface side of the projection optical system 6. The nozzle portion 18 is an annular member in which an opening (light passing through portion) 18a is formed at the center thereof. The optical element 10 is housed in the opening 18a. The nozzle portion 18 can be formed of, for example, aluminum (Al), titanium (Ti), stainless steel, duralumin, or an alloy containing them. Alternatively, the nozzle portion 18 may be formed of a transparent member (optical member) having optical transparency, such as glass (quartz).

The nozzle portion 18 is provided with a liquid supply port 18b arranged so as to face the immersion area AR2 over the exposure stage 3 and the immersion area AR3 over the measurement stage 4. The liquid supply port 18b is provided in the lower surface of the nozzle portion 18.

The nozzle portion 18 also has, within itself, a supply channel 18c corresponding to the liquid supply port 18b. One end of the supply channel 18c is coupled to the liquid supply unit 8a via the supply pipe 8b, while the other end is coupled to the liquid supply port 18b.

A mass flow controller 8c is provided in the middle of the supply pipe 8b, which is used for controlling a supply amount per unit time of a liquid that has been sent out from the liquid supply unit 8a and is to be supplied to the liquid supply port 18b. The control of the supply amount of the liquid is performed by the mass flow controller 8c under a command signal of the controller 7.

The nozzle portion 18 is provided with a liquid recovery port 18d arranged so as to face the immersion area AR2 over the exposure stage 3 and the immersion area AR3 over the measurement stage 4. The liquid recovery port 18d is provided in the lower surface of the nozzle portion 18.

The nozzle portion 18 further has, within itself, a recovery channel 18e corresponding to the liquid recovery port 18d. One end of the recovery channel 18e is coupled to the liquid recovery unit 9a via the recovery pipe 9b, while the other end is coupled to the liquid recovery port 18d.

An operation of each of the liquid supply unit 8a and the mass flow controller 8c is controlled by the controller 7. That is, an amount per unit time of the immersion water LQ supplied from the liquid supply unit 8a can be controlled by the controller 7, and further an amount per unit time of the immersion water LQ supplied from the liquid supply port 18b is individually regulated by the mass flow controller 8c that can be controlled by the controller 7. The immersion water LQ is sent out by the liquid supply unit 8a and is then supplied from the liquid supply port 18b via the supply pipe 8b and the supply channel 18c. In this case, the liquid supply port 18b is arranged outside the projection area AR1 of the projection optical system 6 such that the immersion water LQ is supplied from outside the projection area AR1 via the liquid supply port 18b.

An operation of the liquid recovery unit 9a is controlled by the controller 7. That is, an amount per unit time of the immersion water LQ supplied by the liquid recovery unit 9a can be controlled by the controller 7. The immersion water LQ recovered from the liquid recovery port 18d is recovered in the liquid recovery unit 9a via the recovery channel 18e in the nozzle portion 18 and the recovery pipe 9b. In this case, the liquid recovery port 18d is arranged outside the liquid supply port 18b such that the immersion water LQ is recovered from outside the liquid supply port 18b via the liquid recovery port 18d.

Although the supply pipe 8b is coupled to the single liquid supply unit 8a in the present embodiment, a plurality of the liquid supply units 8a (e.g., two pieces), the number of the liquid supply units 8a corresponding to the number of the supply pipes 8b, may be provided to couple each of the supply pipes 8d to each of the liquid supply units 8a.

In addition, although the recovery pipe 9b is coupled to the single liquid recovery unit 9a, a plurality of the liquid recovery units 9a (e.g., two pieces), the number of the liquid recovery units 9a corresponding to the number of the recovery pipes 9b, may be provided to couple each of the recovery pipes 9b to each of the liquid recovery units 9a.

The pressure regulation mechanism 11 has a function of regulating the pressure of the immersion water LQ supplied from the liquid supply mechanism 8 and is provided with both a supply pressure regulation unit 11a for regulating the supply pressure of the immersion water LQ supplied from the liquid supply mechanism 8 and a recovery pressure regulation unit 11b for regulating the recovery pressure of the immersion water LQ to be recovered into the liquid recovery mechanism 9.

Subsequently, the arrangement of the exposure stage 3 and the measurement stage 4 will be described.

At the time of exposure, the exposure stage 3 is transferred under the projection optical system 6 and the nozzle portion 18 to held the immersion water LQ in the immersion area AR2, while the measurement stage 4 is waiting at a predetermined position. At the time other than the exposure, for example, at the time of exchange of the substrate SW or measurement (various regulations of the focus, the optical system alignment, etc.), the measurement stage 4 is transferred under the projection optical system 6 and the nozzle portion 18 to held the immersion water LQ in the immersion area AR3. By the exposure stage 3 and the measurement stage 4 being transferred in a state where the two are close to each other when these two states are changed to each other, the immersion water LQ can be transferred between the exposure stage 3 and the measurement stage 4.

Subsequently, a series of operations of the exposure stage 3 and the measurement stage 4 will be described with reference to FIGS. 2A to 2D. FIGS. 2A to 2D are schematic views explaining a series of operations of the exposure stage 3 and the measurement stage 4.

Figure 2A:
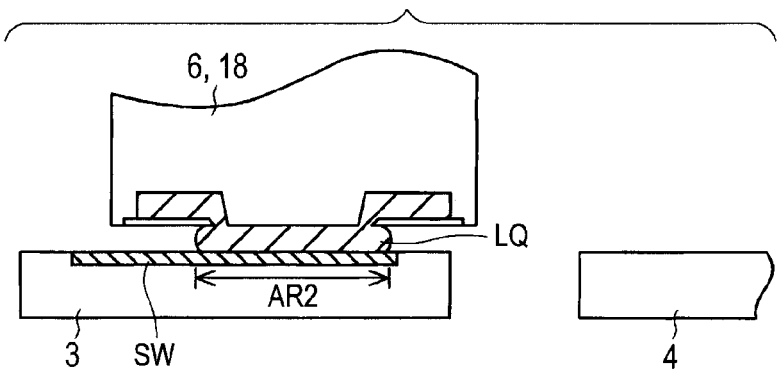
FIGS. 2A to 2D are schematic views explaining a series of operations of an exposure stage and a measurement stage, provided in the immersion exposure apparatus according to the embodiment of the invention.
Figure 2B:
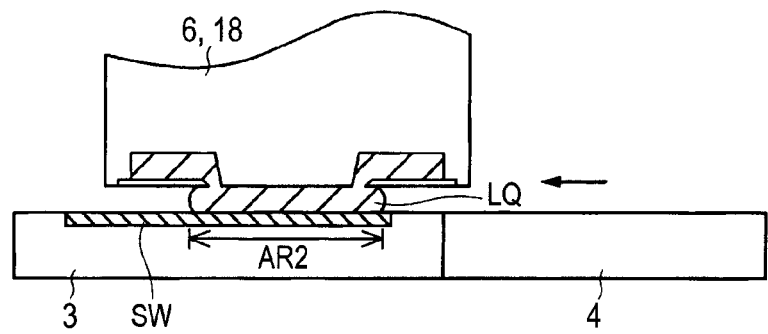
Figure 2C:
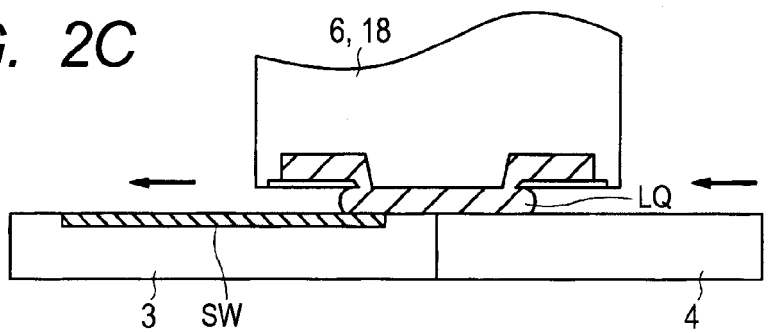
Figure 2D:
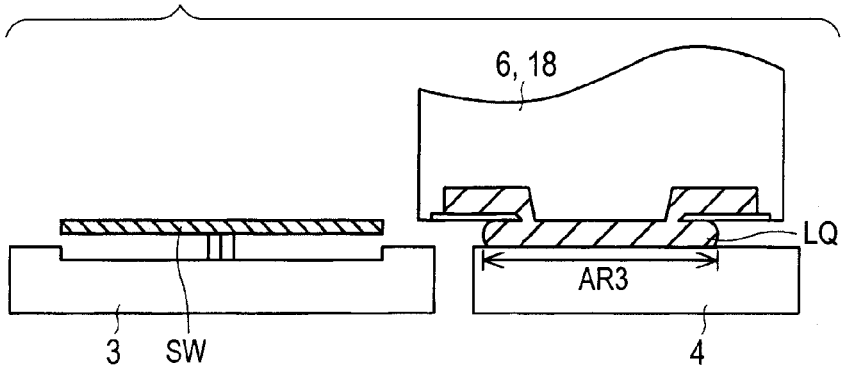

At the time of exposure, the exposure stage 3 is first located under the projection optical system 6 and the nozzle portion 18, and the measurement stage 4 is waiting at a predetermined position, as illustrated in FIG. 2A. After the exposure has been completed, the measurement stage 4 is then transferred in a direction under the projection optical system 6 and the nozzle portion 18 to approach the exposure stage 3, as illustrated in FIG. 2B. The immersion water LQ is then transferred from the exposure stage 3 to the measurement stage 4 in a scram operation, as illustrated in FIG. 2C. Thereafter, various regulations of the focus or the optical system alignment, etc., are performed over the measurement stage 4 during the exchange of the substrate SW over the exposure stage 3, as illustrated in FIG. 2D.

At the time of exposure (previous FIG. 2A), the immersion water LQ is held, over the exposure stage 3, in the immersion area AR2 between each of the lower surfaces of the projection optical system 6 and the nozzle portion 18 and the surface of the resist coated on the major surface of the substrate SW (not only the resist, but also a resist on which an organic material (Top Coat) has been coated are included). The space between the lower surface of the nozzle portion 18 and the surface of the resist is, for example, smaller than or equal to 1 mm.

At the time of measurement (previous FIG. 2D), the immersion water LQ is held, over the measurement stage 4, in the immersion area AR3 between each of the lower surfaces of the projection optical system 6 and the nozzle portion 18 and the upper surface of the measurement stage 4. The space between the lower surface of the nozzle portion 18 and the upper surface of the measurement stage 4 is, for example, smaller than or equal to 1 mm.

Herein, a transverse spread (spread in a direction parallel to the upper surface of the exposure stage 3) of the immersion water LQ in the immersion area AR2 over the exposure stage 3 is made smaller than a transverse spread (spread in a direction parallel to the upper surface of the measurement stage 4) of the immersion water LQ in the immersion area AR3 over the measurement stage 4.

Subsequently, a first method and a second method of regulating the transverse spread of the immersion water LQ in each of the immersion area AR2 over the exposure stage 3 and the immersion area AR3 over the measurement stage 4, will be described below.

At first, the first method will be described with reference to the aforementioned FIG. 1.

As the first method, an amount of the immersion water LQ held in the immersion area AR2 is made smaller than that of the immersion water LQ held in the immersion area AR3 by controlling a supply amount, a recovery amount, or both a supply amount and a recovery amount of the immersion water LQ supplied to each of the immersion area AR2 over the exposure stage 3 and the immersion area AR3 over the measurement stage 4.

Specifically, a flow rate of the immersion water LQ is controlled by a supply amount by the liquid supply unit 8a and a recovery amount by the liquid recovery unit 9a. Alternatively, the flow rate of the immersion water LQ may be individually controlled by the mass flow controller 8c, in addition to these. For example, a flow rate of the immersion water LQ supplied to the immersion area AR2 over the exposure stage 3 can be made to be L (m$^3$/sec) and a flow rate thereof supplied to the immersion area AR3 over the measurement stage 4 can be made to be L+α (m$^3$/sec).

Alternatively, a supply pressure of the immersion water LQ is controlled by the pressure regulation unit 11a in the pressure regulation mechanism 11 and a recovery pressure thereof is controlled by the recovery pressure regulation unit 11b therein. For example, when a reference supply pressure of the immersion water LQ is assumed to be X (kPa), a supply pressure of the immersion water LQ supplied to the immersion area AR2 over the exposure stage 3 can be made to be X−β' (kPa) and that of the immersion water LQ supplied to the immersion area AR3 over the measurement stage 4 can be made to be X+β (kPa). In addition, when a reference recovery pressure of the immersion water LQ is, for example, assumed to be Y (kPa), a recovery pressure of the immersion water LQ recovered from the immersion area AR2 over the exposure stage 3 can be made to be Y+γ' (kPa) and that of the immersion water LQ recovered from the immersion area AR3 over the measurement stage 4 can be made to be Y−γ (kPa). Alternatively, the control of the flow rate of the immersion water LQ and that of the supply pressure and the recovery pressure thereof may be performed in combination.

Subsequently, the second method will be described with reference to FIG. 3. FIG. 3 is a schematic view explaining the immersion area AR2 over the exposure stage 3 and the immersion area AR3 over the measurement stage 4, provided in the immersion exposure apparatus.

As the second method, the water repellency of the upper surface (liquid contact surface) of the measurement stage 4, the immersion water LQ being brought into contact with the upper surface, is made smaller than that of the resist coated on the major surface of the substrate SW (not only the resist, but also a resist on which an organic material (Top Coat) has been coated are included). Because the dynamic receding contact angle of the resist 19 is 65° or larger and 84° or smaller, a material having, for example, a dynamic receding contact angle smaller than 65° is used for the measurement stage 4. The whole measurement stage 4 may be formed of a material having water repellency whose dynamic receding contact angle is smaller than 65°, alternatively a thin film having water repellency whose dynamic receding contact angle is smaller than 65° may be formed only on the liquid contact surface of the measurement stage 4.

The lower surfaces of both the optical element 10 in the projection optical system 6 and the nozzle portion 18 have hydrophilicity. For example, a thin film made of a material having a molecular structure whose polarity is large, such as alcohol, is formed on the lower surfaces of both the optical element 10 in the projection optical system 6 and the nozzle portion 18, alternatively $MgF_2$, $Al_2O_3$, $SiO_2$, or the like is formed thereon. Thereby, the lower surfaces of both the optical element 10 in the projection optical system 6 and the nozzle portion 18 can be made hydrophilic. Because the upper surface of the measurement stage 4 has water repellency lower than that of the resist 19, the transverse spread of the immersion water LQ in the immersion area AR3 over the measurement stage 4 can be made larger than that of the immersion water LQ in the immersion area AR2 over the exposure stage 2. In this case, the immersion water LQ is likely to leak outside the immersion area Ar3 over the measurement stage 4, and hence a water-repellent plate 20 having water repellency higher than that of the upper surface of the measurement stage 4 is installed around the immersion area AR3.

The transverse spread of the immersion water LQ in the immersion area AR2 over the exposure stage 3 can be made smaller than that of the immersion water LQ in the immersion area AR3 over the measurement stage 4 by making the water repellency of the resist 19 (or the organic material (Top Coat) on the surface of the resist 19) to be higher than that occurring when a dynamic receding contact angle is, for example, larger than 84°. However, if the water repellency of the resist 19 (or the organic material (Top Coat) on the surface of the resist 19) is high, it is considered that the immersion exposure may become difficult due to the repelling of the immersion water LQ. Accordingly, it is considered that the water repellency of them may be, for example, 65° or larger and 84° or smaller in terms of a dynamic receding contact angle, and that the most appropriate water repellency of the upper surface of the measurement stage 4 may be, for example, approximately 64° in terms of a dynamic receding contact angle.

The spread of the immersion water LQ can be confirmed by, for example, a CCD (Charge Coupled Device) camera, etc., installed in the immersion exposure apparatus 1.

In the present embodiment, a dynamic receding contact angle (D-RCA) is used for the definition of water repellency. As illustrated in FIG. 4, a dynamic receding contact angle refers to the angle between the tangent of a liquid droplet and the surface on which the liquid droplet is present in a dynamic situation where the interface of the liquid droplet moves in a three-phase (solid/liquid/gas) interface. As a liquid has more affinity with the surface, the contact angle becomes smaller. However, water repellency are defined in various ways other than a dynamic receding contact angle, and specifications of water repellency are different from each other, depending on definition ways.

By making the transverse spread of the immersion water LQ in the immersion area AR2 over the exposure stage 3 to be smaller than that in the immersion area AR3 over the measurement stage 4, as stated above, the following advantage can be obtained.

That is, because the liquid recovery port 18d in the nozzle portion 18 is also immersed in the immersion water LQ over the exposure stage 3, minute foreign substances in the immersion water LQ are sometimes adhered to the liquid recovery port 18d in the nozzle portion 18, etc. However, because the transverse spread of the immersion water LQ in the immersion area AR3 over the measurement stage 4 is larger than that of the immersion water LQ in the immersion area AR2 over the exposure stage 3, the liquid recovery port 18d in the nozzle portion 18, to which the foreign substances have been adhered during exposure, is always immersed in the immersion water LQ. Accordingly, the foreign substances adhered to the liquid recovery port 18d in the nozzle portion 18, etc., during exposure are neither dried nor firmly fixed thereto, and hence an increases in the number of foreign substances and in the size of a foreign substance can be prevented. Thereby, adherence of a foreign substance to the surface of the resist 19 coated on the major surface of the substrate SW, occurring during immersion exposure, can be suppressed, which can prevent a shape defect, etc., in a transfer pattern.

Subsequently, a method of manufacturing a semiconductor device according to the present embodiment will be described in the order of the processes with reference to FIGS. 5 to 10. Herein, the case where the present invention has been applied to the manufacture of a CMIS (Complementary Metal Insulator Oxide Semiconductor) device will be described as an example; however, it is needless to say that the invention can be applied to the manufacture of another semiconductor device.

Figure 5:
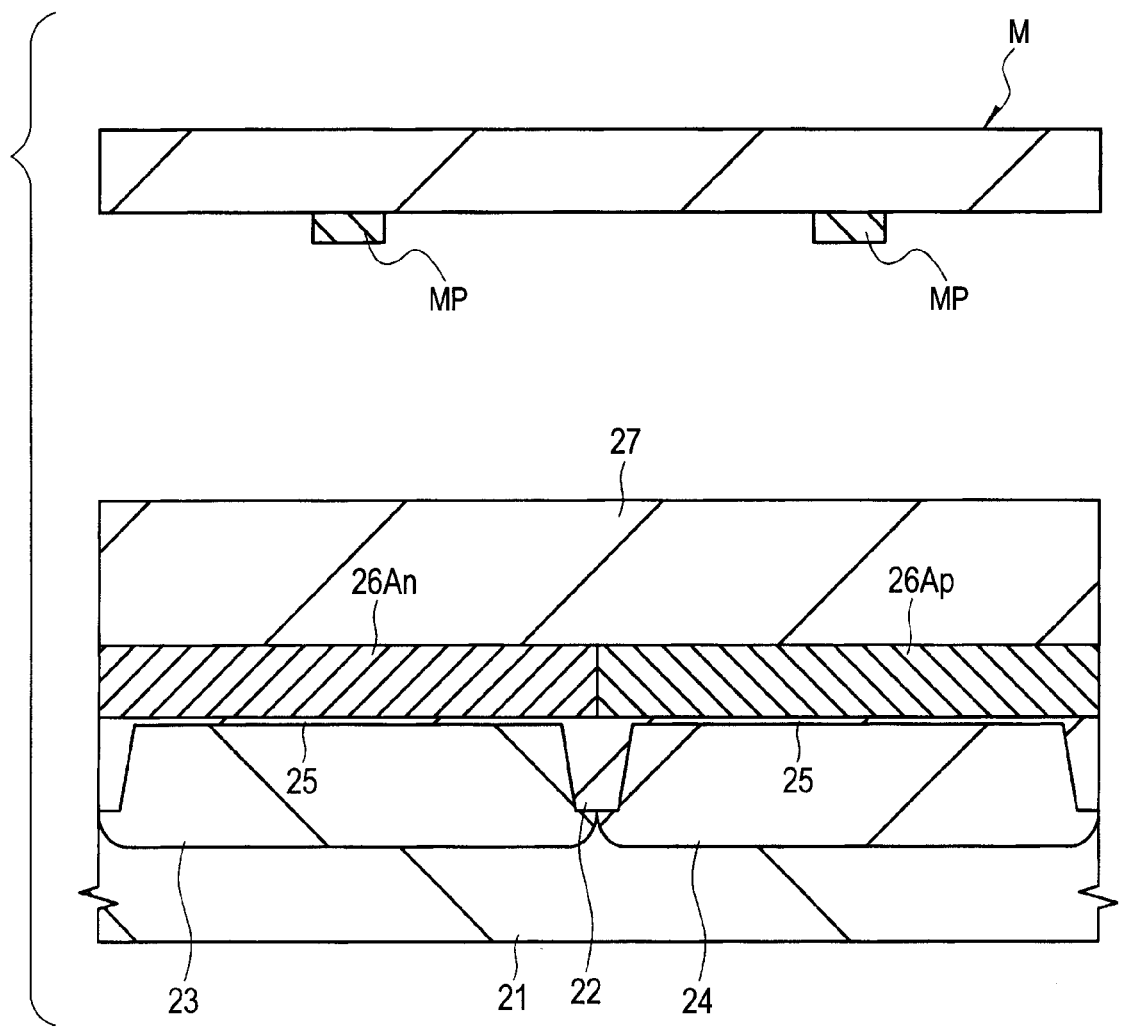
FIG. 5 is a sectional view of an important portion of a semiconductor device during a manufacturing process for explaining a method of manufacturing a semiconductor device according to the embodiment of the invention.
Figure 6:
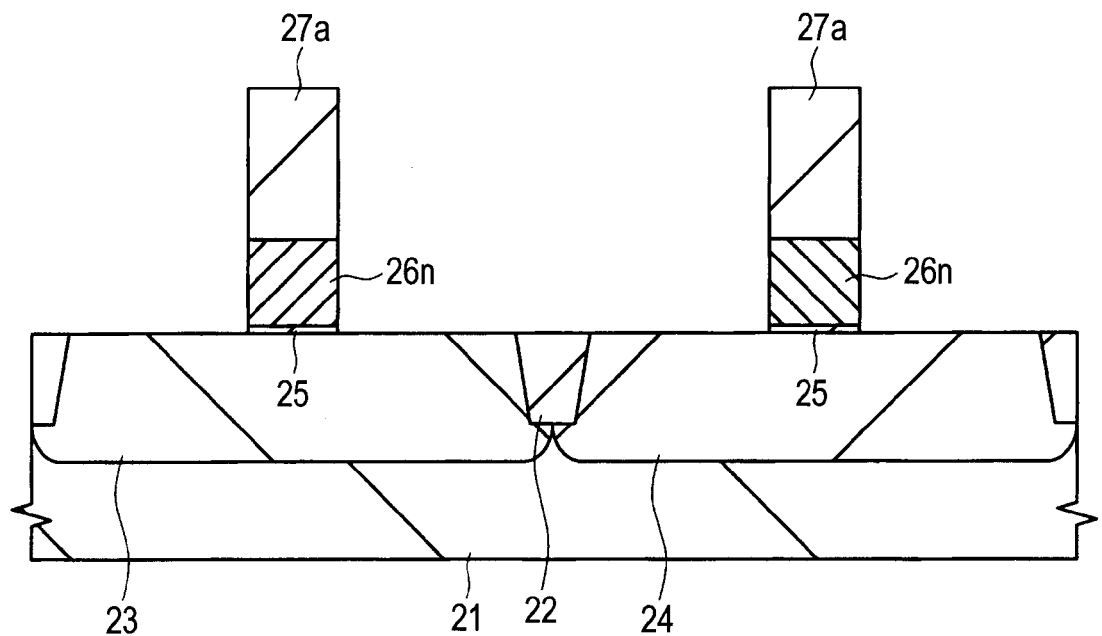
FIG. 6 is a sectional view of the same important portion as that in FIG. 5, during the manufacturing process of a semiconductor device following FIG. 5.

As illustrated in FIG. 5, a semiconductor substrate (semiconductor thin plate called wafer whose plane has an approximately circular shape) 21 made of, for example, single crystalline silicon is first prepared. A separation portion 22 made of an insulating film is then formed in an element separation area over the major surface of the semiconductor substrate 21. Thereafter, a p-type well 23 is formed by ion-implanting impurities exhibiting p-type conductivity into an area (nMIS forming area) of the semiconductor substrate 21 where an nMIS is to be formed. Likewise, an n-type well 24 is formed by ion-implanting impurities exhibiting n-type conductivity into an area (pMIS forming area) of the semiconductor substrate 1 where a pMIS is to be formed.

A gate insulating film 25 is then formed over the major surface (each surface of the p-type well 23 and the n-type well 24). A conductive film 26An of which an nMIS gate electrode is comprised is then formed over the gate insulating film 25 in the nMIS forming area. Likewise, a conductive film 26Ap of which a pMIS gate electrode is comprised is formed over the gate insulating film 25 in the pMIS forming area. The conductive film 26An is a polycrystalline silicon film into which, for example, impurities exhibiting n-type conductivity have been introduced, while the conductive film 26Ap is a polycrystalline silicon film into which, for example, impurities exhibiting p-type conductivity have been introduced.

Subsequently, after a resist 27 has been coated on the conductive films 26An and 26Ap, immersion exposure of a mask pattern MP formed in the mask M is performed on the resist 27 by using the aforementioned immersion exposure apparatus 1. Thereafter, a development process is performed to form a resist pattern 27a that serves as a mask in processing the conductive films 26An and 26Ap. Because a shape defect, etc. in the resist pattern 27a, resulting from foreign substances during exposure, can be prevented in the immersion exposure apparatus 1, the resist pattern 27a having fine wires of, for example, 45 nm in width can be formed at a high yield.

Subsequently, an nMIS gate electrode 26n is formed over the gate insulating film 25 in the nMIS forming area by processing the conductive films 26An and 26Ap with dry etching in which the resist pattern 27a is used as a mask. Likewise, a pMIS gate electrode 26p is formed over the gate insulating film 25 in the pMIS forming area.

Figure 7:
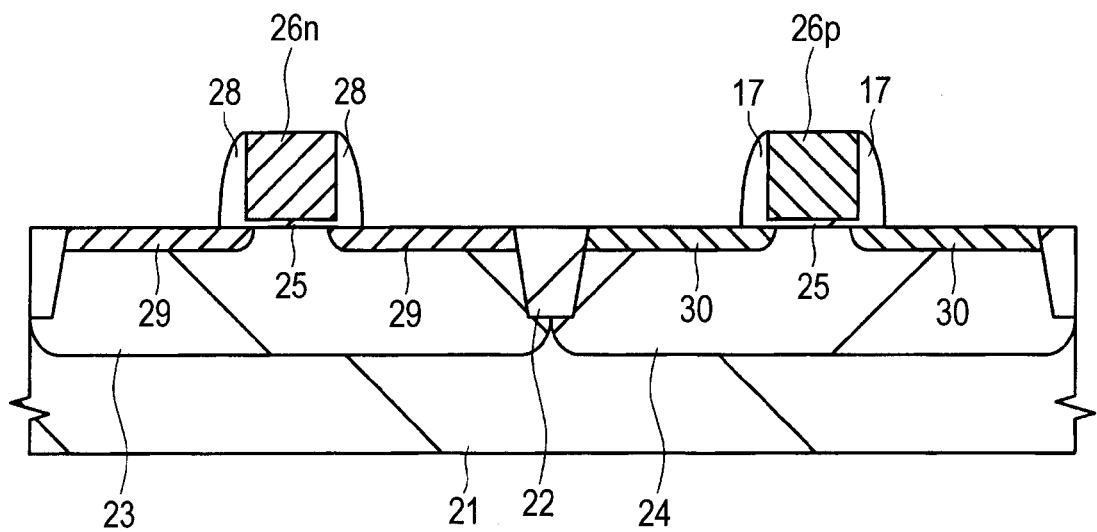
FIG. 7 is a sectional view of the same important portion as that in FIG. 5, during the manufacturing process of a semiconductor device following FIG. 6.

Subsequently, after the resist pattern 27a has been removed, a sidewall 28 is formed on each of the side walls of the nMIS gate electrode 26n and the pMIS gate electrode 26p, as illustrated in FIG. 7. Impurities exhibiting n-type conductivity are then ion-implanted into the p-type well 23 on both sides of the nMIS gate electrode 26n, thereby forming an n-type semiconductor area 29 that functions as an nMIS source drain in a self-aligning manner with respect to the gate electrode 6n and the sidewall 28. Likewise, impurities exhibiting p-type conductivity are ion-implanted into the n-type well 24 on both sides of the pMIS gate electrode 26p, thereby forming a p-type semiconductor area 30 that functions as a pMIS source drain in a self-aligning manner with respect to the gate electrode 26p and the sidewall 28.

Figure 8:
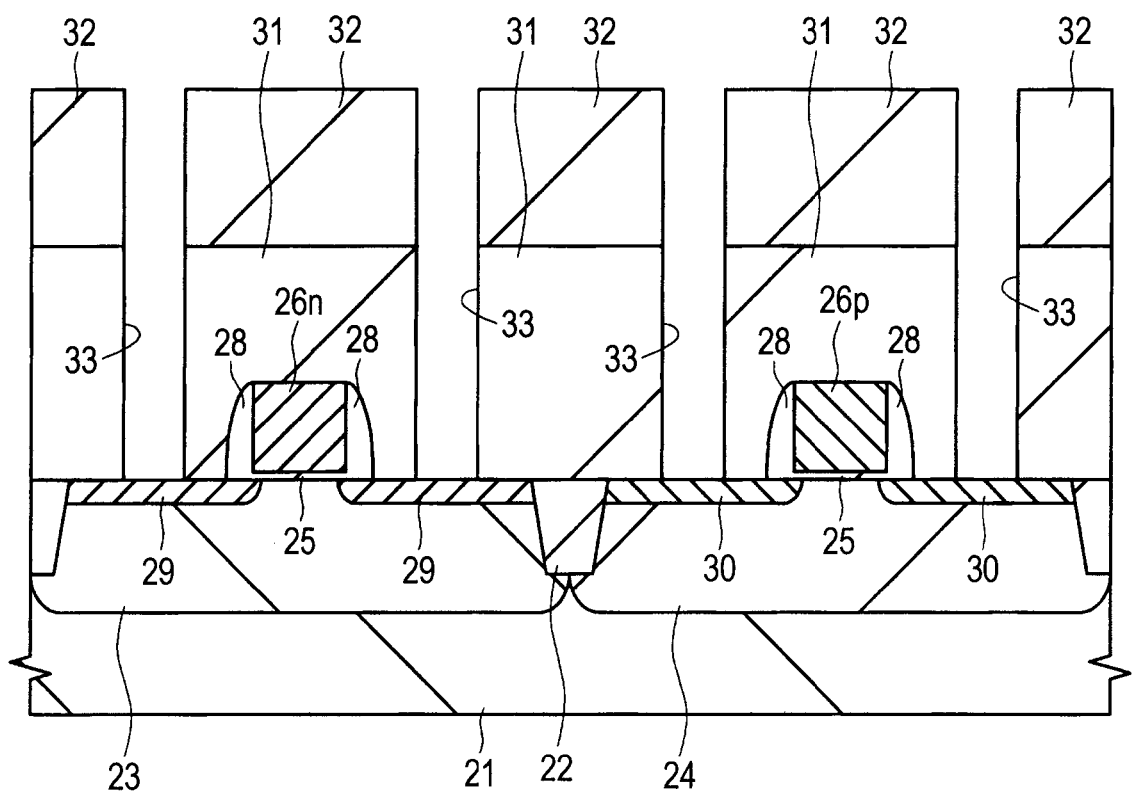
FIG. 8 is a sectional view of the same important portion as that in FIG. 5, during the manufacturing process of a semiconductor device following FIG. 7.

Subsequently, an insulating film 31 is formed over the major surface of the semiconductor substrate 21, as illustrated in FIG. 8. Subsequently, after a resist has been coated on the insulating film 31, immersion exposure is performed by using the aforementioned immersion exposure apparatus 1. A development process is then performed to form a resist pattern 32 that serves as a mask in processing the insulating film 31. Because a shape defect, etc., in the resist pattern 32, resulting from foreign substances during exposure, can be prevented in the immersion exposure apparatus 1, the resist pattern 32 having grooves of, for example, 70 nm in width can be formed at a high yield.

Subsequently, a coupling hole 33 is formed by processing the insulating film 31 with dry etching in which the resist pattern 32 is used as a mask. This coupling hole 33 is formed in a necessary portion over the n-type semiconductor area 29 or the p-type semiconductor area 30.

Figure 9:
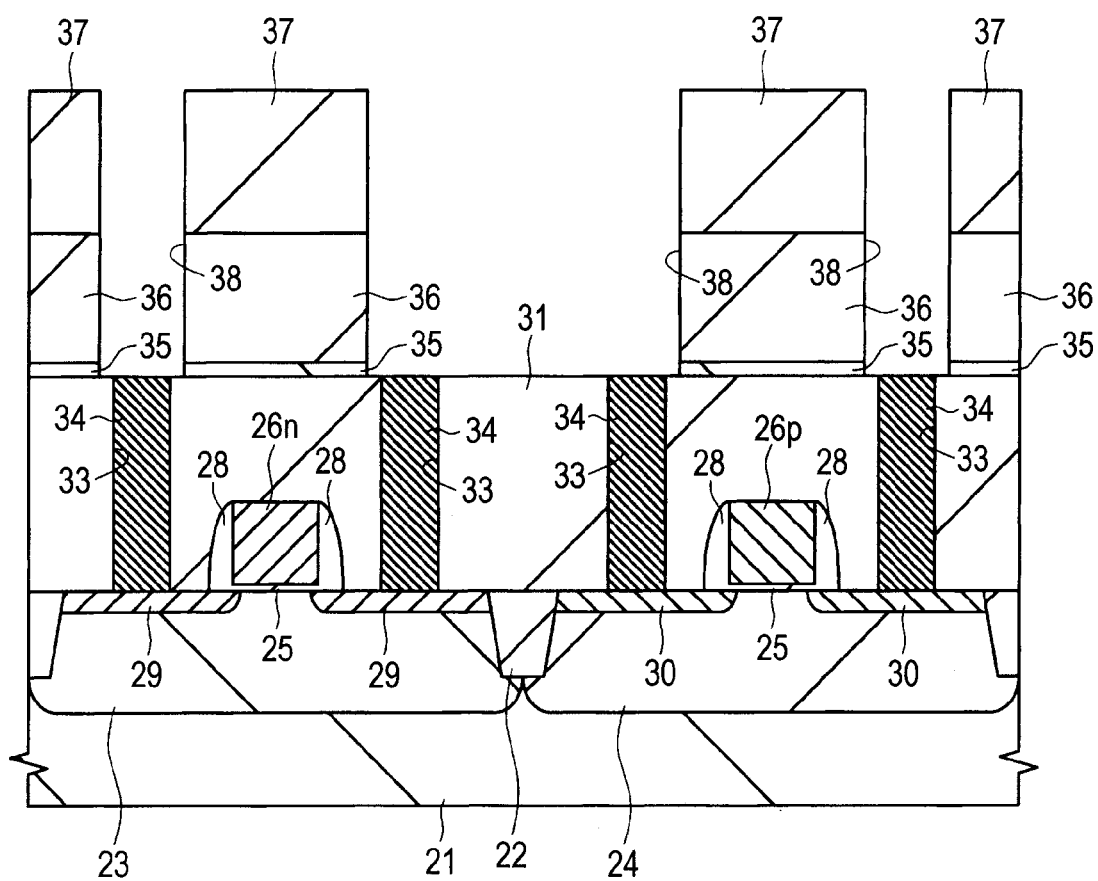
FIG. 9 is a sectional view of the same important portion as that in FIG. 5, during the manufacturing process of a semiconductor device following FIG. 8.

Subsequently, after the resist pattern 32 has been removed, a plug 34 whose main conductor is, for example, a tungsten (W) film is formed in the coupling hole 33, as illustrated in FIG. 9. Then, a stopper insulating film 35 and an insulating film 36 over which wiring is to be formed are sequentially formed over the major surface of the semiconductor substrate 21. The stopper insulating film 35 is a film that serves as an etching stopper in forming grooves over the insulating film 36, and is made of a material having etching selectivity with respect to the insulating film 36. The stopper insulating film 35 can be a silicon nitride film formed by, for example, a plasma CVD (Chemical Vapor Deposition) method, while the insulating film 36 can be a silicon oxide film formed by, for example, a plasma CVD method.

Subsequently, after a resist has been coated on the on insulating film 36, immersion exposure is performed by using the aforementioned immersion exposure apparatus 1. A development process is then performed to form a resist pattern 37 that is used as a mask in processing the stopper insulating film 35 and the insulating film 36. Because a shape defect, etc., in the resist pattern 37, resulting from foreign substances during exposure, can be prevented in the immersion exposure apparatus 1, the resist pattern 37 having grooves of, for example, 70 nm in width can be formed at a high yield.

Subsequently, wiring grooves 38 each having a concaved shape are formed in a predetermined area of each of the stopper insulating film 35 and the insulating film 36 by dry etching in which the resist pattern 37 is used as a mask.

Figure 10:
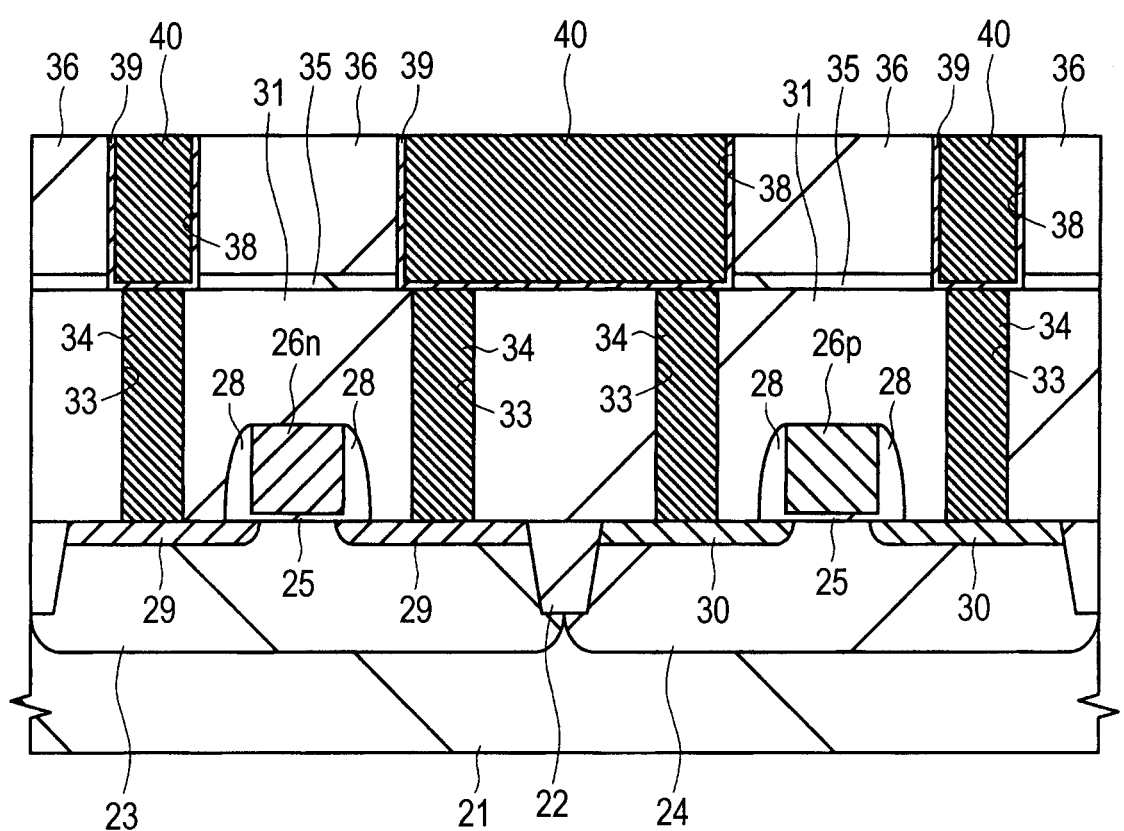
FIG. 10 is a sectional view of the same important portion as that in FIG. 5, during the manufacturing process of a semiconductor device following FIG. 9.

Subsequently, a barrier metal film 39 is formed over the major surface of the semiconductor substrate 21, as illustrated in FIG. 10. The barrier metal film 39 is, for example, a titanium nitride (TiN) film, a tantalum (Ta) film, a tantalum nitride (TaN) film, or the like. A copper (Cu) seed layer (not illustrated) is then formed over the barrier metal film 39 by a CVD method or a sputtering method, and a copper plated film 40 is further formed over the seed layer by using an electroplating method. The interior portions of the wiring grooves 38 are covered with the copper plated film 40.

Subsequently, the copper plated film 40, the seed layer, and the barrier metal film 39 in the areas other than the interior portions of the wiring grooves 38, are removed by a CMP (Chemical Mechanical Polishing) method to form the wiring in a first layer whose main conductor is a copper film. In the present embodiment, the copper film, which is a main conductor of the wiring in the first layer, has been formed by an electroplating method; however, it may be formed by a CVD method, sputtering method, sputter reflow method, or the like.

Although not illustrated, after wiring in a further upper layer is formed, a passivation film, by which entry of moisture and impurities from outside into the uppermost layer is prevented and by which transmission of α-rays is suppressed, is then formed over the wiring in the uppermost layer. Subsequently, after part of the wiring (bonding pad portion) in the uppermost layer has been exposed by processing the passivation film with etching in which the resist pattern is used as a mask, a bump base electrode is formed by being coupled to the wiring in the exposed uppermost layer to form a bump electrode by being coupled to the bump base electrode. Thereby, a semiconductor device according to the present embodiment is almost completed. This bump electrode serves as an external coupling electrode. Thereafter, semiconductor chips are individually cut off from the wafer to be implemented into a package substrate, etc. These description will be omitted.

In the present embodiment, a shape defect, etc., resulting from adherence of foreign substances, occurring during immersion exposure, can be prevented in a resist pattern formed over the major surface of the substrate SW by using the immersion exposure apparatus 1, as stated above, thereby allowing the manufacturing yield of semiconductor devices to be improved.

As stated above, the invention made by the present inventors has been specifically described based on embodiments; however, it is needless to say that the invention should not be limited to the embodiments and various modifications can be made to the embodiments within a range not departing from the gist of the invention.

For example, the first method and the second method have been described as a method of regulating the transverse spread of the immersion water in the immersion area over the exposure stage and that of the immersion water in the immersion area over the measurement stage; however, methods of regulating them should not be limited thereto. Alternatively, the first method and the second method may be used in combination.

The present invention can be applied to semiconductor devices manufactured by an exposure method in which a substrate is exposed via a projection optical system and a liquid.

What is claimed is:

1. A method of manufacturing a semiconductor device comprising the steps of:
   (a) coating a resist on the major surface of a substrate;
   (b) transferring a pattern image of a mask onto the resist by radiating exposure light onto the resist via a projection optical system and immersion water; and
   (c) after the above (b) step, performing a development process on the resist to form a resist pattern over the major surface of the substrate,
   wherein the (b) step includes the steps of:
   (b-1) holding the immersion water in a first immersion area between the resist and each of the lower surfaces of an optical element of the projection optical system and a lower surface of a nozzle portion for supplying and recovering the immersion water, in a state where a first stage for supporting the substrate is located under the projection optical system and the nozzle portion when exposure light is radiated onto the resist; and
   (b-2) holding the immersion water in a second immersion area between each of the lower surfaces of the optical element of the projection optical system and the lower surface of the nozzle portion and the upper surface of a second stage different from the first stage, in a state where the second stage is located under the projection optical system and the nozzle portion when exposure light is not radiated onto the resist,
   wherein a transverse spread of the immersion water held in the first immersion area in the (b-1) step is smaller than a transverse spread of the immersion water held in the second immersion area in the (b-2) step by controlling a supply amount of said immersion water using a liquid supply unit or by controlling a supply pressure of said immersion water using a pressure regulation unit.

2. The method of manufacturing a semiconductor device according to claim 1,
   wherein the nozzle portion is provided around the optical element, and a liquid supply port for supplying the immersion water and a liquid recovery port for recovering the immersion water are provided in the lower surface of the nozzle portion.

3. The method of manufacturing a semiconductor device according to claim 1,
   wherein an amount of the immersion water held in the first immersion area is made smaller than that of the immersion water held in the second immersion water, by controlling a recovery amount, or both said supply amount and a recovery amount of the immersion water.

4. The method of manufacturing a semiconductor device according to claim 1,
   wherein a water repellency of the liquid contact surface of the second stage is lower than a water repellency of the surface of the resist.

5. The method of manufacturing a semiconductor device according to claim 1, wherein a dynamic receding contact angle of the liquid contact surface of the second stage is smaller than 65° and a dynamic receding contact angle of the surface of the resist is 65° or larger and 84° or smaller.

6. The method of manufacturing a semiconductor device according to claim 1,
wherein a water repellent plate is provided around the second immersion area over the second stage and a water repellency of the water repellent plate is higher than a water repellency of the liquid contact surface of the second stage.

7. A method of manufacturing a semiconductor device comprising the steps of:
(a) coating a resist on the major surface of a substrate;
(b) transferring a pattern image of a mask onto the resist by radiating exposure light onto the resist via a projection optical system and immersion water; and
(c) after the above (b) step, performing a development process on the resist to form a resist pattern over the major surface of the substrate,
wherein the (b) step includes the steps of:
(b-1) holding the immersion water in a first immersion area between the resist and each of the lower surfaces of an optical element of the projection optical system and a lower surface of a nozzle portion for supplying and recovering the immersion water, in a state where a first stage for supporting the substrate is located under the projection optical system and the nozzle portion when exposure light is radiated onto the resist; and
(b-2) holding the immersion water in a second immersion area between each of the lower surfaces of the optical element of the projection optical element and the lower surface the nozzle portion and the upper surface of a second stage different from the first stage, in a state where the second stage is located under the projection optical system and the nozzle portion when exposure light is not radiated onto the resist,
wherein an amount of the immersion water held in the first immersion area in the (b-1) step is made smaller than an amount of the immersion water held in the second immersion area in the (b-2) step by controlling a supply amount using a liquid supply unit, a recovery amount, or both a supply amount and a recovery amount of the immersion water, by controlling a supply amount of said immersion water using a liquid supply unit, or by controlling a supply pressure of said immersion water using a pressure regulation unit.

8. The method of manufacturing a semiconductor device according to claim 7,
wherein the nozzle portion is provided around the optical element, and a liquid supply port for supplying the immersion water and a liquid recovery port for recovering the immersion water are provided in the lower surface of the nozzle portion.

9. The method of manufacturing a semiconductor device according to claim 7,
wherein the supply amount or the recovery amount of the immersion water is controlled by a flow rate of the immersion water.

10. The method of manufacturing a semiconductor device according to claim 7,
wherein a recovery amount of the immersion water is controlled by a recovery pressure of the immersion water.

11. The method of manufacturing a semiconductor device according to claim 7, wherein a transverse spread of the immersion water held in the first immersion area is smaller than a transverse spread of the immersion water held in the second immersion area.

12. A method of manufacturing a semiconductor device comprising the steps of:
(a) coating a resist on the major surface of a substrate;
(b) transferring a pattern image of a mask onto the resist by radiating exposure light onto the resist via a projection optical system and immersion water; and
(c) after the above (b) step, performing a development process on the resist to form a resist pattern over the major surface of the substrate,
wherein the (b) step includes the steps of:
(b-1) holding the immersion water in a first immersion area between the resist and each of the lower surfaces of an optical element of the projection optical system and a lower surface of a nozzle portion for supplying and recovering the immersion water, in a state where a first stage for supporting the substrate is located under the projection optical system and the nozzle portion when exposure light is radiated onto the resist; and
(b-2) holding the immersion water in a second immersion area between each of the lower surfaces of the optical element of the projection optical system and the lower surface of the nozzle portion and the upper surface of a second stage different from the first stage, in a state where the second stage is located under the projection optical system and the nozzle portion when exposure light is not radiated onto the resist,
wherein a water repellency of the liquid contact surface of the second stage is lower than a water repellency of the surface of the resist, and
wherein a transverse spread of the immersion water held in the first immersion area in the (b-1) step is smaller than a transverse spread of the immersion water held in the second immersion area in the (b-2) step by controlling a supply amount of said immersion water using a liquid supply unit or by controlling a supply pressure of said immersion water using a pressure regulation unit.

13. The method of manufacturing a semiconductor device according to claim 12,
wherein the nozzle portion is provided around the optical element, and a liquid supply port for supplying the immersion water and a liquid recovery port for recovering the immersion water are provided in the lower surface of the nozzle portion.

14. The method of manufacturing a semiconductor device according to claim 12,
wherein a dynamic receding contact angle of the liquid contact surface of the second stage is smaller than 65° and a dynamic receding contact angle of the surface of the resist is 65° or larger and 84° or smaller.

15. The method of manufacturing a semiconductor device according to claim 12,
wherein a water repellent plate is provided around the second immersion area over the second stage and a water repellency of the water repellent plate is higher than a water repellency of the liquid contact surface of the second stage.

16. The method of manufacturing a semiconductor device according to claim 12,
wherein a transverse spread of the immersion water held in the first immersion area is smaller than a transverse spread of the immersion water held in the second immersion area.

* * * * *